(12) United States Patent

Pinckney

(10) Patent No.: US 6,461,680 B2
(45) Date of Patent: Oct. 8, 2002

(54) SIMPLIFIED FABRICATION METHOD OF TOROIDAL CHARGED PARTICLE DEFLECTOR VANES

(75) Inventor: David J. Pinckney, Danbury, CT (US)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/471,613

(22) Filed: Dec. 23, 1999

(65) Prior Publication Data

US 2001/0052467 A1 Dec. 20, 2001

(51) Int. Cl.[7] .............................. B05D 3/02; B05D 5/12; C25D 5/02; C25D 5/50
(52) U.S. Cl. ................... 427/383.1; 427/259; 427/265; 427/383.3; 427/383.5; 427/304; 427/305; 427/116; 205/118; 205/224
(58) Field of Search ................................. 205/157, 162, 205/164, 183, 187, 205, 224, 920; 438/584, 678, 687; 427/98, 118, 304, 305, 372.2

(56) References Cited

U.S. PATENT DOCUMENTS 5,100,714 A    3/1992   Zsamboky ............... 428/137
5,218,761 A  * 6/1993   Maniwa et al. ............ 29/852
5,454,927 A   10/1995   Credle et al. ............ 205/123
5,733,468 A    3/1998   Conway, Jr. ............. 216/21

FOREIGN PATENT DOCUMENTS

JP   1-262691 A  * 10/1989
JP   1-262691    * 10/1989

OTHER PUBLICATIONS

Abstract only.*

* cited by examiner

Primary Examiner—Edna Wong
(74) Attorney, Agent, or Firm—Whitham, Curtis & Christofferson, P.C.

(57) ABSTRACT

The present invention relates to a method and apparatus of fabricating electromagnetic coil vanes. The method involves photolithographically exposing high resolution, dense wire patterns in a flash coat of copper, on both sides of a ceramic vane substrate. The substrate can be pre-drilled with a through hole to connect the two copper coil patterns. Additional copper is then deposited on both high resolution patterns and in the through hole by plating until the desired thickness is obtained. A firing operation is then performed that eutectically bonds the copper to the ceramic.

18 Claims, 5 Drawing Sheets

SIMPLIFIED FABRICATION METHOD OF TOROIDAL CHARGED PARTICLE DEFLECTOR VANES

CROSS-REFERENCE TO RELATED APPLICATIONS

This application is related to U.S. patent applications Ser. No. 09/324,899, filed Jun. 3, 1999, now U.S. Pat. No. 6,153,885, by Rodney Kendall for "Toroidal Charged particle Deflector With High Mechanical Stability and Accuracy" (Nikon Corporation Docket NC98-592), and Ser. No. 09/325,162, filed Jun. 3, 1999, now pending, by Rodney Kendall and David Pinckney for "Fabrication Method of High Precision, Thermally Stable Electromagnetic Coil Vanes" (Nikon Corporation Docket NC98-591), and assigned to a common assignee herewith. Co-pending U.S. patent application Ser. Nos. 09/324,899 and 09/325,162 are incorporated herein by reference.

DESCRIPTION

BACKGROUND OF THE INVENTION

1. Field of the Invention

The present invention generally relates to Charged Particle Beam Projection Systems, and more particularly, to a method for fabricating high precision, thermally stable electromagnetic coil vanes used with Charged Particle Beam Projection Systems.

2. Background Description

Yokes and electromagnetic lenses are widely used in charged particle beam tools such as electron beam tools, electron microscopes, and cathode ray tubes and ion beam systems. Yokes and lenses employing toroidal magnetic deflection coils are commonly used in electron beam lithography systems for focusing an electron beam onto a substrate for submicron patterning of semiconductor devices.

U.S. Pat. No. 4,251,728 to Pfeiffer shows an example of a toroidal magnetic deflection yoke. FIG. 1 shows a top view of a traditional toroidal yoke similar to that shown in Pfeiffer. The traditional yoke includes a plastic form having slots numbered from 1 to 20, and forms both X and Y coil axes.

Presently, electromagnetic coils are formed by winding wire into multiple radial grooves cut into a plastic form. Also, deflection yokes have been made from round wire, with bondable insulative coatings. The method used for winding the form to make the coils requires alternating between the X and the Y windings. As the number of radially cut grooves and the number of turns increases, so does the degree of difficulty and the time involved for winding the form to make the coils.

Ser. No. 09/325,162 by Rodney Kendall and David Pinckney for "Fabrication Method of High Precision, Thermally Stable Electromagnetic Coil Vanes" (Nikon Corporation Docket NC98-591) discloses a method and apparatus for fabricating electromagnetic coil vanes having two complementary patterns of approximately 22–23 American Wire Gauge (AWG) uninsulated rectangular cross section wire to be accurately bonded to a thin substrate. The wires preferably are made from thin sheets of copper, via wire electrical discharge machining (EDM), which enables many coils (preferably 50 or more) to be cut from stacked copper sheets, clamped together. The wire cross-section produced by this technique is rectangular with vertical sidewalls. This method requires specialized tooling to mechanically align and clamp the machined coils to the substrate, and a bonding composition that adheres the coils to the substrate.

U.S. Pat. No. 5,100,714 to Zsamboky describes a process of forming a thin copper film which is bonded to a ceramic substrate. This copper film is then patterned via photolithography and plated to build up the copper thickness. U.S. Pat. No. 5,733,468 to Conway describes similar photolithography steps used to produce an image in thin copper and then plating to increase the copper thickness. The initial thin copper is in a foil form. U.S. Pat. No. 5,454,927 to Credle et al. describes a method to fill via holes in a ceramic substrate. The methods disclosed in these patents are not used for devices whose object is to carry substantial current, but instead are used for fabricating printed circuits and like electronic devices.

SUMMARY OF THE INVENTION

It is therefore an object of the invention to provide a method for fabricating high precision, thermally stable electromagnetic coil vanes that provides a more accurate coil vane pattern placement.

It is another object of the invention to provide a method for fabricating high precision, thermally stable electromagnetic coil vanes that does not require specialized tooling to align and clamp the copper coils.

It is yet another object of the present invention to provide a method for fabricating high precision, thermally stable electromagnetic coil vanes that does not require the use of a bonding composition to bond the copper coils to the substrate.

According to the invention, a method is provided to fabricate high current capacity, high accuracy, thermally stable deflection yokes used to generate off axis beam deflections.

In the preferred embodiment, electromagnetic coil vanes are formed having two complementary patterns of approximately 25–28 AWG uninsulated rectangular cross section copper wire. The copper wire is formed by accurately depositing the copper on opposing sides of a thin substrate, and subsequently bonding the copper to the substrate. Preferably, the coefficient of thermal expansion (CTE) of the thin substrate should be low. For example, in a preferred embodiment, ceramic can be used, which has a CTE of approximately $7 \times 10^{-6}/°$ C. The two complementary copper coil patterns are electrically connected by a plated through hole. The gaps between adjacent copper wires must be as small as possible to maximize the copper wire pattern density and thus the effectiveness of the coil.

The method involves photolithographically exposing high resolution, dense wire patterns in a flash coat of copper, on both sides of a ceramic vane substrate. Additional copper is then deposited on both high resolution patterns and in the through hole by plating until the desired thickness of copper is obtained. Preferably, the copper is deposited simultaneously on both sides of the substrate. Then a firing operation is performed that bonds the copper wires to the substrate without the use of a bonding composition.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
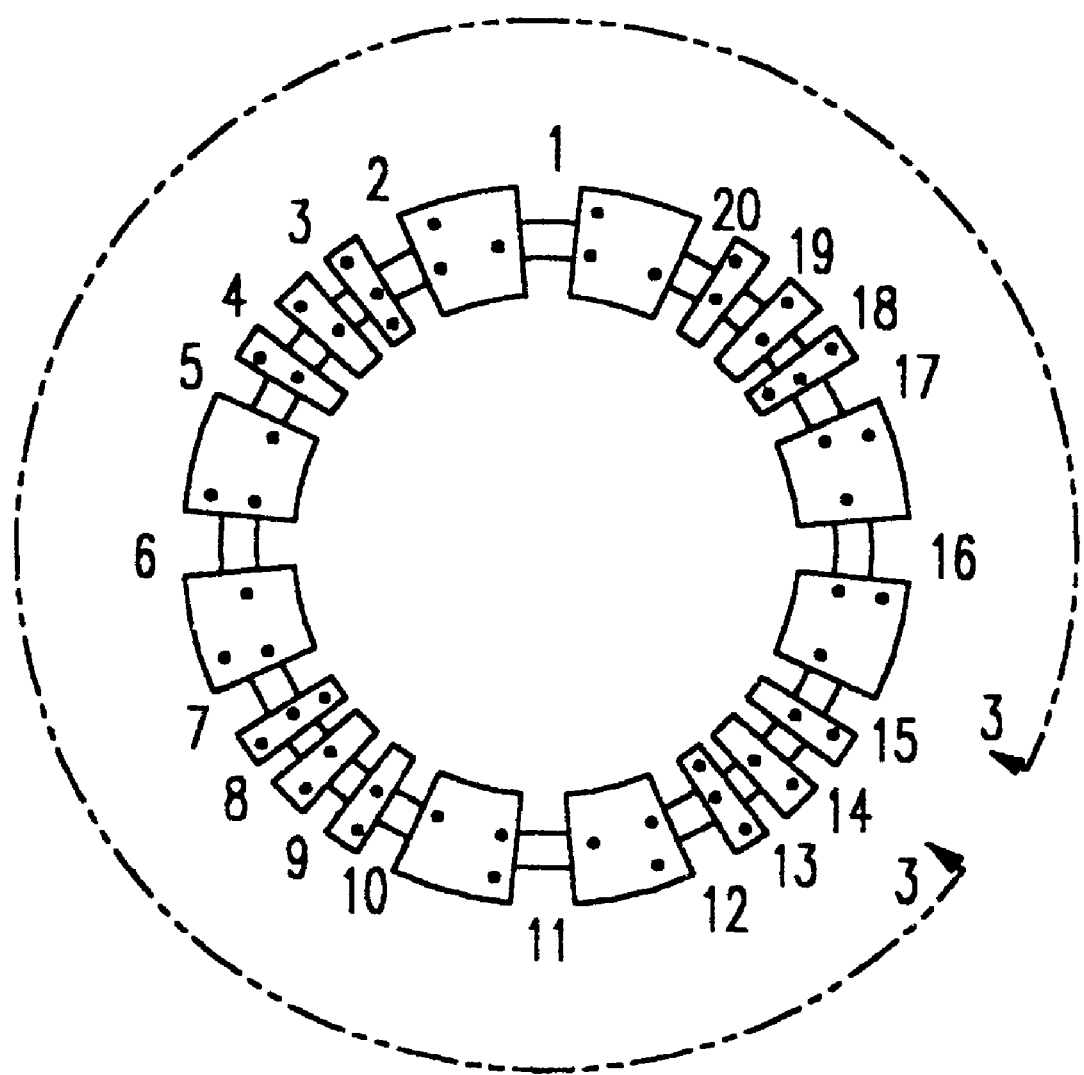
FIG. 1 shows a top view of a related art toroidal yoke.
Figure 2:
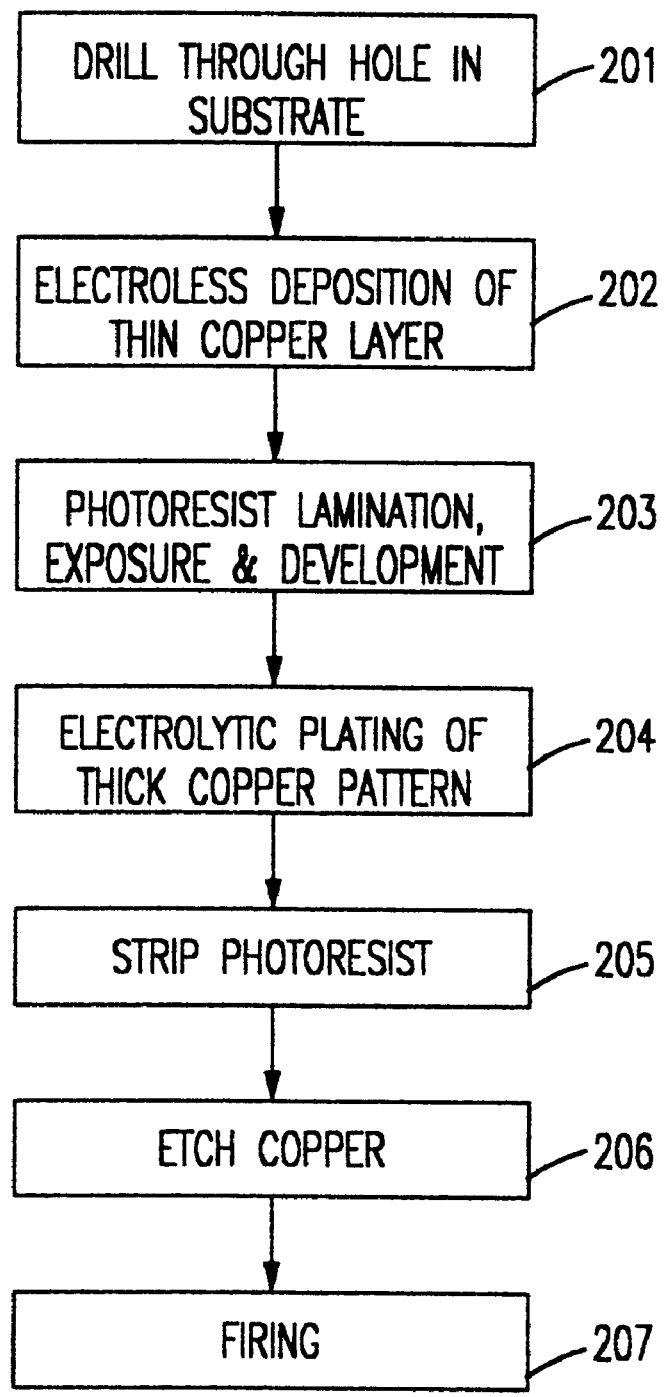
FIG. 2 is a flowchart of the method of the present invention.

Referring now to the drawings, and specifically to FIG. 2, a flowchart is provided for the present process. Beginning with step 201, a through hole 400 is drilled through substrate 303, which provides an electrical connection between coil patterns 301 and 302. Drilling is preferably done in either the conventional manner or by laser action. The substrate 303 preferably has a low coefficient of thermal expansion (CTE). For example, in a preferred embodiment, any particular ceramic can be used that has a CTE of approximately $7 \times 10^{-6}/°$ C. Other wires and substrates may also be used with the present invention, depending on the particular application. For example, Zerodur®, produced by Schott Glaswerke (Mainz, Germany) may also be used as a substrate.

At step 202, a thin layer of copper 401 is deposited over the entire surface of the substrate 303 and in the through hole 400 by electroless deposition. This step is necessary to create a conductive layer on the substrate surface and on the interior surface of the through hole 400 for subsequent plating 402, as discussed below. The thickness of the thin copper layer 401 deposited by electroless deposition is approximately 2–3 microns, which is very small relative to the thickness of the final trace.

Figure 4:
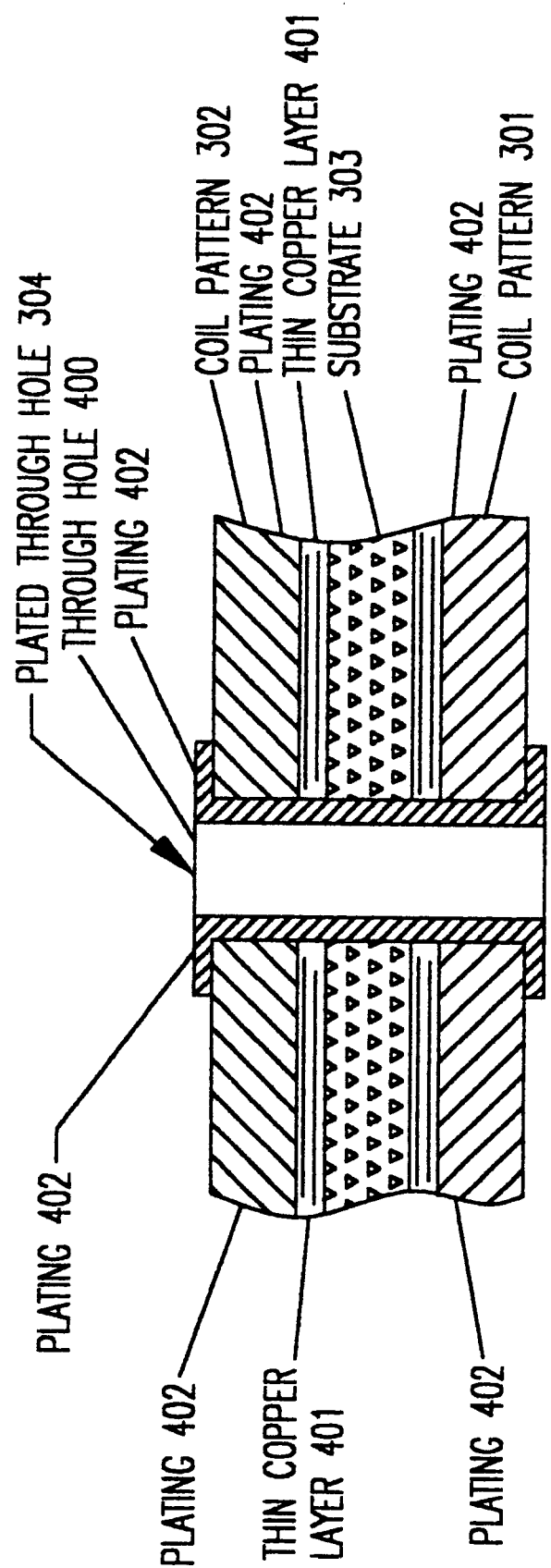
FIG. 4 shows an interconnection between the two coil patterns through the substrate.

At step 203, the substrate 303 is laminated with a photoresist layer, which is then exposed and developed in the conventional manner to define a negative mask for a desired pattern of signal traces on the substrate 303. In step 204, electrolytic copper pattern plating 402 is used to deposit a relatively thick layer of copper on the exposed conductive surfaces of the substrate 303 (as defined by the photoresist layer). The electrolytic plating deposits a thick horizontal layer of copper 402 over the exposed portions of the substrate 303, as well as in through hole 400. In a preferred embodiment, the electromagnetic coil vane requires the formation of two complementary copper coil patterns 301 and 302 directly on the substrate, of preferably approximately 25–28 AWG, uninsulated rectangular cross section wire. The wire cross-section produced by this technique is rectangular with substantially vertical sidewalls. The gaps between the adjacent wires in wire patterns 301 and 302 must be as small as possible to maximize the copper wire pattern density and thus the effectiveness of the coil. Preferably, the ratio of wire width to gap is at least 2.5:1. The copper plating 402, in conjunction with the thin copper layer 401, also forms an interconnection between the wire patterns 301 and 302 at the through hole 400, as shown in FIG. 4. The photoresist layer is then removed in step 205.

In step 206, the substrate 303 is etched, preferably using a cupric chloride solution to remove copper from all exposed surfaces on the substrate 303. The etchant slightly reduces the thickness of the thick copper pattern layer, and slightly rounds its corners. However, due to the much greater thickness of the thick copper pattern from plating 402, the thin copper layer 401 will be completely removed from the surface of substrate 303 by the etchant before the thick copper layer from plating 402 is significantly affected. Alternatively, an ammoniacal etchant could be substituted, but is not preferred.

In step 207, the substrate and copper coil pattern is fired in a furnace to a temperature just below the melting point of copper. Specifically, it is preferred that the copper coil be heated to a temperature at a melting point of the eutectic composition of copper and the copper oxide that naturally forms on the copper. The eutectic composition of the copper and its oxide forms a bond with the substrate 303.

Figure 3:
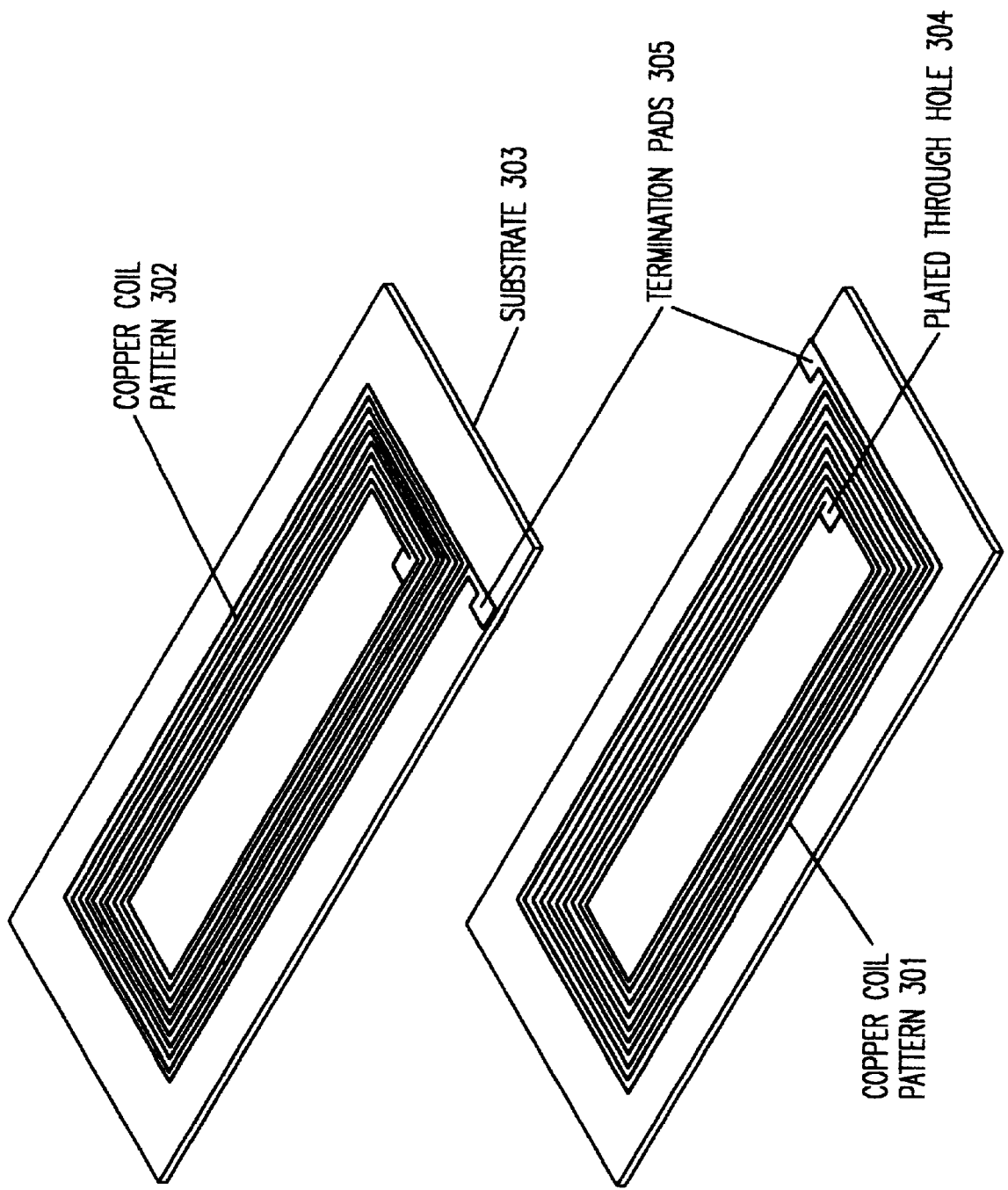
FIGS. 3A and 3B, taken together, show an electromagnetic coil vane of the present invention.

FIGS. 3A and 3B show the resulting electromagnetic coil vane of the present invention. The termination pad 305 provided on coil patterns 301 and 302 is a terminal portion of the coil wire where electric current is applied to the electromagnetic coil vane.

The plated through hole 304 is formed during deposition and, as shown in FIG. 4, in a pre-drilled hole of substrate 303. The plated through hole 304 electrically connects coil pattern 301 and coil pattern 302. The completed electromagnetic coil vane as shown in FIGS. 3A and 3B is thus provided.

Figure 5:
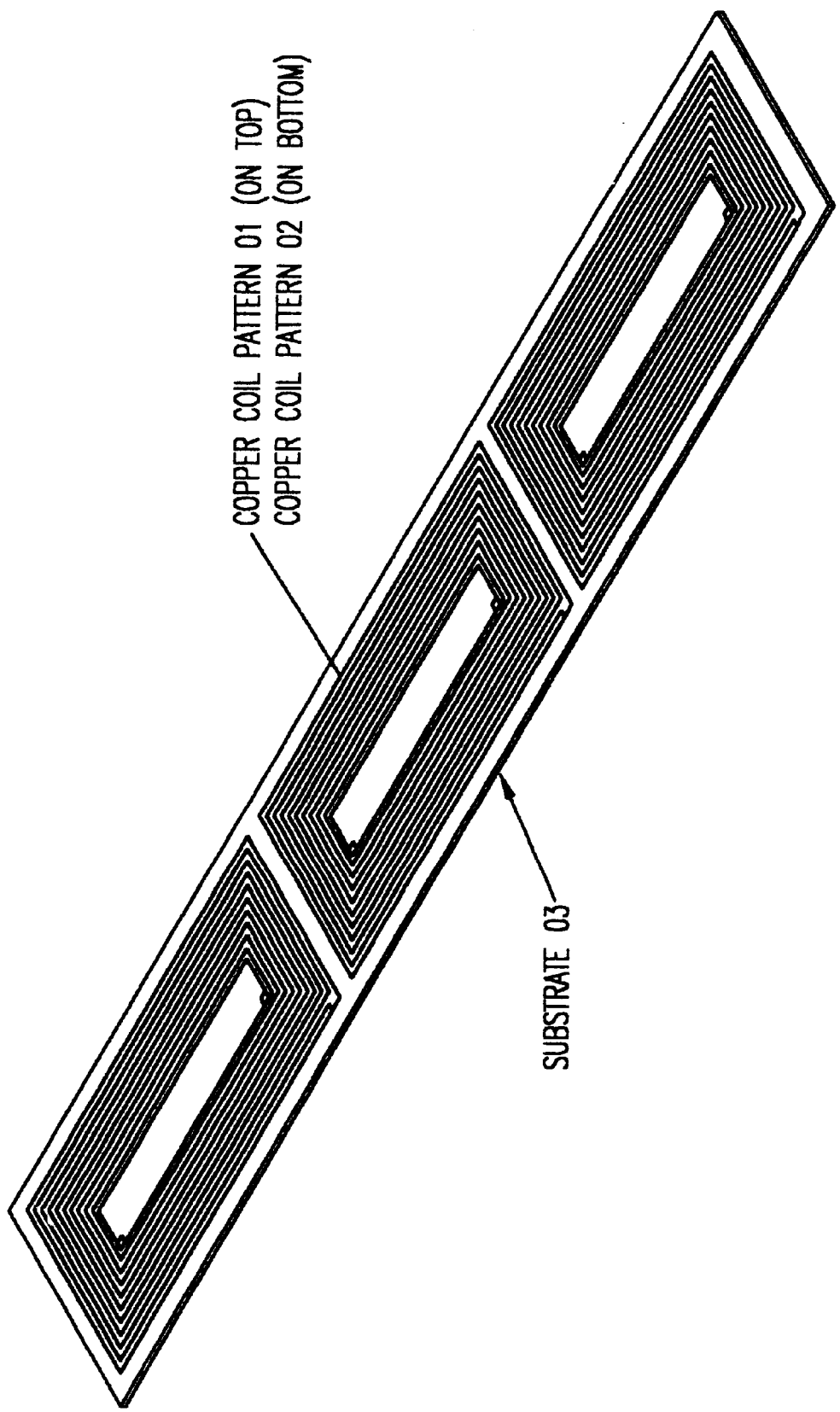
FIG. 5 shows three electromagnetic coil vanes of the present invention.

In view of the foregoing, it is seen that the invention provides a method for fabricating high precision, thermally stable electromagnetic coil vanes. This meritorious effect of the invention will also be produced in variations of the invention. For example, as shown in FIG. 5, the invention can also be practiced by providing a plurality of coil patterns 301 and 302 on each side of substrate 303.

While the invention has been described in terms of preferred embodiments, those skilled in the art will recognize that the invention can be practiced with modification within the spirit and scope of the appended claims.

Having thus described my invention, what I claim as new and desire to secure by letters patent is as follows:

1. A method for fabricating high precision thermally stable electromagnetic coil vanes, comprising steps of:
    forming a through hole in a substrate;
    depositing a thin metal layer over an entire surface of opposing surfaces of the substrate;
    forming exposed wire patterns on the thin layer of metal on the opposing surfaces of the substrate with a resist;
    depositing a metal on the exposed wire patterns until a desired thickness is obtained, forming a thick metal layer;
    removing the resist and a portion of the thin metal layer deposited on each of the opposing surfaces of the substrate and underlying the resist; and
    heating the substrate and the deposited metal thereon to bond the metal to the substrate, wherein the heating is done at a temperature substantially equal to the melting point of a eutectic composition of copper and an oxide of the copper.

2. The method as recited in claim 1, wherein the bond is a eutectic bond.

3. The method as recited in claim 1, that further includes the step of depositing the thin layer of metal in the through hole.

4. A method as recited in claim 1, wherein the wire patterns have a ratio of a wire width to a gap of at least 2.5:1.

5. The method as recited in claim 1, wherein the substrate has a low coefficient of thermal expansion.

6. The method as recited in claim 5, wherein the substrate is ceramic.

7. The method as recited in claim 1, wherein the deposited thin metal layer comprises copper.

8. The method as recited in claim 7, wherein the thin metal layer has a thickness of 2–3 microns.

9. The method as recited in claim 1, wherein the deposited thick metal layer comprises copper.

10. The method as recited in claim 1, wherein the deposited th in metal layer is applied by electroless deposition.

11. The method as recited in claim 1, wherein the thick metal layer is applied by electrolytic plating.

12. The method as recited in claim 1, wherein said resist is patterned as a negative mask.

13. A method for fabricating a high precision, thermally stable coil vane, said method including steps of depositing a thin metal layer over surfaces of a thermally stable substrate having a through hole formed therein, masking portions of said thin metal layer with a mask leaving exposed portions of said thin metal layer in said through hole and a coil pattern, depositing metal on said exposed portions of said thin metal layer to form a thick metal layer, removing said mask from said portions of said thin metal layer, removing said portions of said thin metal layer exposed when said mask is removed, and thermally bonding said thick metal layer to said thermally stable substrate wherein said thermally bonding step forms a eutectic bond at a temperature approximating a melting point of a metal of said thick metal layer and an oxide of the metal of said thick metal layer.

14. A method as recited in claim 13 wherein said coil pattern has a ratio of approximately 2.5:1 between portions of said thick metal layer forming wires of said coil pattern and separation of said wires of said coil pattern.

15. A method as recited in claim 13 wherein said metal is copper.

16. A method as recited in claim 13 wherein said thermally bonding step forms a eutectic bond at a temperature approximating a melting point of copper and copper oxide.

17. A method as recited in claim 13, wherein said thermally stable substrate is ceramic having a coefficient of thermal expansion of approximately $7 \times 10^{-6}/° C$.

18. A method as recited in claim 13, wherein a cross-sectional area of said coil pattern of said thick layer of metal approximates 25–28 AWG.

* * * * *